(12) United States Patent
Yoneya

(10) Patent No.: US 7,767,488 B2
(45) Date of Patent: Aug. 3, 2010

(54) METHOD FOR FORMING A STACKED STRUCTURE OF AN INSULATING LAYER AND AN ORGANIC SEMICONDUCTOR LAYER, ORGANIC FIELD EFFECT TRANSISTOR AND METHOD FOR MAKING SAME

(75) Inventor: Nobuhide Yoneya, Kanagawa (JP)

(73) Assignee: Sony Corporation, Tokyo (JP)

( * ) Notice: Subject to any disclaimer, the term of this patent is extended or adjusted under 35 U.S.C. 154(b) by 163 days.

(21) Appl. No.: 11/424,672

(22) Filed: Jun. 16, 2006

(65) Prior Publication Data

US 2006/0289859 A1 Dec. 28, 2006

(30) Foreign Application Priority Data

Jun. 27, 2005 (JP) ............................. 2005-186554

(51) Int. Cl.
*H01L 51/40* (2006.01)
(52) U.S. Cl. ....................................................... 438/99
(58) Field of Classification Search .................... 438/99
See application file for complete search history.

(56) References Cited

U.S. PATENT DOCUMENTS

2006/0273302 A1* 12/2006 Birau et al. .................... 257/40

OTHER PUBLICATIONS

Klauk, Hagen "High-mobility polymer gate dielectric pentacene thin film transistors" Journal of Applied Physics vol. 92 No. 9 Nov. 1, 2002 pp. 5259-5263.*
Jin et al. ("Jin" Jin, S. H. "PMMA Buffer-Layer Effects on Electrical Performance of Pentacene OTFTs with a Cross-linked PVA Gate Insulator on a Flexible Substrate" SID Symposium Digest of Technical Papers May 2003 vol. 34, Issue 1 pp. 1088-1091).*
Lin et al., "Stacked Pentacene Layer Organic Thin-Film Transistors with Improved Characteristics," IEEE Electron Device Letters, vol. 18, pp. 606-608, Dec. 1997.

* cited by examiner

*Primary Examiner*—N Drew Richards
*Assistant Examiner*—Grant S Withers
(74) *Attorney, Agent, or Firm*—K&L Gates LLP

(57) ABSTRACT

A method for making an organic field effect transistor of a bottom gate/bottom contact type or a bottom gate/top contact type is provided. The method comprises (a) forming a gate electrode 12 on a support and forming a gate insulating layer 13 on the support 10 and the gate electrode 12, and (b) forming, on the gate insulating layer 13, source/drain electrodes 14 and an organic semiconductor region 15 made of an organic semiconductor material and constituting a channel forming region 16. The gate insulating layer 12 is formed by applying a solution of a mixture of an insulating polymer material and a surface treating agent onto the support 10 and the gate electrode 12 and drying. The organic field effect transistors are also provided.

10 Claims, 7 Drawing Sheets

METHOD FOR FORMING A STACKED STRUCTURE OF AN INSULATING LAYER AND AN ORGANIC SEMICONDUCTOR LAYER, ORGANIC FIELD EFFECT TRANSISTOR AND METHOD FOR MAKING SAME

CROSS REFERENCES TO RELATED APPLICATIONS

The present application claims priority to Japanese Patent Application JP2005-186554 filed with the Japanese Patent Office on Jun. 27, 2005, the entire contents of which being incorporated herein by reference.

BACKGROUND

This application relates to a method for forming a stacked structure made of an insulating layer and an organic semiconductor layer, and also to an organic field effect transistor and a method for making same.

Existing field effect transistors (FET) including thin film transistors (TFT) that have been employed in various types of electronic devices are constituted, for example, of a channel forming region and source/drain electrodes formed in a silicon semiconductor substrate or a silicon semiconductor material layer, a gate insulating layer formed on the surface of the silicon semiconductor substrate or silicon semiconductor material layer and formed of $SiO_2$, and a gate electrode provided in face-to-face relation with the channel forming region through a gate insulating layer. It will be noted that FET having such a structure as mentioned above is called "top gate FET" for convenience's sake. Alternatively, such transistors may be constituted of a gate electrode formed on a support, a gate insulating layer made of $SiO_2$ and formed on the support including the gate electrode, and a channel forming region and source/drain electrodes formed over the gate insulating layer. It is to be noted that the FET having such a structure as mentioned above is called "bottom gate FET" for convenience's sake. For the manufacture of these field effect transistors having the structures mentioned above, very expensive semiconductor manufacturing apparatuses have been in use and thus, there is a strong demand for reducing manufacturing costs.

To meet the demand, attention has been drawn to studies and developments of organic FET's wherein organic semiconductor materials that are capable of making FET based on a method using no vacuum technique, such as spin coating, printing or spraying are used to form a channel forming region consisting of an organic semiconductor layer.

By the way, organic FET's are required as being capable of high speed operation because it is required that they be assembled in many electronic devices including display devices. For instance, organic FET should be ones wherein video signals are converted to data as needed and are capable of performing on/off switching operations at high speed.

For instance, with bottom gate organic FET's, a gate insulating layer made of $SiO_2$ has been conventionally used. In order to improve the performance of a bottom gate organic FET or to improve the crystallinity of an organic semiconductor layer constituting a channel forming region, the surface of the gate insulating layer is treated with a surface treating agent, typical of which is a silane coupling agent, followed by forming a channel forming region by use of an organic semiconductor material (see, for example, IEEE Electron Letters, Vol. 18, No. 12, p. 606 (1997), written by Y. Y. Lin et at.).

For the treatment with a surface treating agent, such as a silane coupling agent, in bottom gate organic FET's, it is necessary that a gate insulating layer be formed, after which the gate insulating layer is subjected, for example, to ashing to permit OH groups to be exposed throughout the surface of the gate insulating film. Consequently, there arises a problem in that the degree of freedom in selection of the type of material for a gate insulating layer and a formation process of the gate insulating layer is low. More particularly, a problem is involved in that it is difficult, for example, to use a material of the type which is able to form a gate insulating layer by a coating procedure.

With top gate organic FET's, a channel forming region made of an organic semiconductor layer is formed on a support. In this case, in order to improve the crystallinity of the organic semiconductor layer forming the channel forming region, it is necessary to treat the surface of the support with a surface treating agent, typically a silane coupling agent. Hence, it is required that the support be uniformly exposed with OH groups on the surfaces thereof, with the attendant problem that the degree of freedom in selection of the type of material for the support and a manufacturing process of the support is low.

Accordingly, there is a need to provide a method for forming a stacked structure made of an insulating layer and an organic semiconductor layer wherein the insulating layer is capable of improving the crystallinity of the organic semiconductor layer. A need also exists to provide a method for making an organic field effect transistor which is able to improve the crystallinity of an organic semiconductor layer constituting a channel forming region and produce an organic field effect transistor having a high performance. There is also a need to provide an organic field effect transistor obtained by the method mentioned above.

SUMMARY

Broadly, the method for forming a stacked structure made of an insulating layer and an organic semiconductor layer according to an embodiment includes the steps of applying a solution of a mixture of a polymer material serving as an insulating material and a surface treating agent onto a substrate, drying the solution to form an insulating layer on the support, and forming an organic semiconductor layer on the insulating layer.

According to a first embodiment of the invention, there is provided a method for making an organic field effect transistor (i.e. a bottom gate/bottom contact or bottom gate/top contact, organic field effect transistor), which has the steps of:

(A) forming a gate electrode on a support and subsequently forming a gate insulating layer on the support and the gate electrode; and (B) forming, on the gate insulating film, source/drain electrodes and an organic semiconductor layer made of an organic semiconductor material and constituting a channel forming region, wherein the gate insulating layer is formed by applying a solution of a mixture of a polymer material serving as an insulating material and a surface treating agent onto the support and the gate electrode and drying the solution.

According to a second embodiment of the invention, there is provided a method for making an organic field effect transistor (i.e. a bottom gate/bottom contact or bottom gate/top contact, organic field effect transistor), which has the steps of:

(A) forming an underlying layer on a support;

(B) forming, on the underlying layer, source/drain electrodes and an organic semiconductor layer made of an organic semiconductor material and constituting a channel forming region; and (C) forming a gate electrode at least on the organic semiconductor layer through a gate insulating layer, wherein the underlying layer is formed by applying a solution of a mixture of a polymer material serving as an insulating material and a surface treating agent onto the support, and drying the solution.

The organic field effect transistor (i.e. a bottom gate/bottom contact, organic field effect transistor) obtained by the method of the first embodiment of the invention includes:

(a) a gate electrode formed on a support;

(b) a gate insulating layer formed on the support and the gate electrode;

(c) source/drain electrodes formed over the gate insulating layer; and (d) a channel forming region which is constituted of an organic semiconductor layer and is formed over a portion of the gate insulating layer located between the source/drain electrodes and the source/drain electrode and in face-to-face relation with the gate electrode, wherein the gate insulating layer is formed by reaction between a surface treating agent and a polymer material serving as an insulating material.

The organic field effect transistor (i.e. a bottom gate/top contact, organic field effect ransistor obtained by the method of the second embodiment of the invention includes:

(a) a gate electrode formed on a support;

(b) a gate insulating layer formed on the support and the gate electrode;

(c) a channel forming region constituted of an organic semiconductor layer and formed over the gate insulating layer in face-to-face relation with the gate electrode; and (d) source/drain electrodes formed over the organic semiconductor layer so as to sandwich the channel forming region therebetween, wherein the gate insulating layer is formed by reaction between a surface treating agent and a polymer material serving as an insulating material.

According to a third embodiment of the invention, there is provided an organic field effect transistor (i.e. a top gate/bottom contact, organic field effect transistor), which includes:

(a) an underlying layer formed on a support;

(b) source/drain electrodes formed on the underlying layer;

(c) a channel forming region constituted of an organic semiconductor layer and formed over a portion of the underlying layer located between the source/drain electrodes and the source/drain electrodes;

(d) a gate insulating film formed on the organic semiconductor layer; and (e) a gate electrode formed on the gate insulating film in face-to-face relation with the channel forming region, wherein the underlying layer is formed by reaction between a surface treating agent and a polymer material serving as an insulating material.

According to a fourth embodiment of the invention, there is provided an organic field effect transistor (i.e. a top gate/top contact, organic field effect transistor), which includes:

(a) an underlying layer formed on a support;

(b) a channel forming region constituted of an organic semiconductor layer and formed on the underlying layer;

(c) source/drain electrodes formed on the organic semiconductor layer so as to sandwich the channel forming region therebetween;

(d) a gate insulating film formed over the channel forming region and the source/drain electrodes; and (e) a gate electrode formed over the gate insulating film in face-to-face relation with the channel forming region, wherein the underlying layer is formed by reaction between a surface treating agent and a polymer material serving as an insulating material.

In the method for forming a stacked structure made of an insulating layer and an organic semiconductor layer and also in the methods of making an organic field effect transistor according to the first and second embodiments of the invention, the polymer material is one that is selected from the group consisting of polyvinyl phenol (hereinafter abbreviated as (P-01)), polyvinyl alcohol (P-02), polymethyl methacrylate (P-03), polyparaxylene (perylene)(P-04), polyhydroxymethylstyrene (P-05), polyvinyl acetate (P-06), polystyrene (P-07), polyvinyl styrene (P-08), polypropylene (P-09), polycarbonate (P-10) and polyvinylidene fluoride (P-11). The surface treating agent is one that is selected from octadecytrichlorosilane (hereinafter abbreviated as (S-01)), octadecyltrimethoxysilane (S-02), octadecyltriethoxysilane (S-03), octyltrichlorosilane (S-04), octyltrimethoxysilane (S-05), octyltriethoxysilane (S-06), hexamethyldisilazane (S-07), methylvinyltrichlorosilane (S-08), octadecyldimethylchlorosilane (S-09), dimethyldimethoxysilane (S-10), methyltrimethoxysilane (S-11), vinyltriethoxysilane (S-12), γ-glycidoxypropyltrimethoxysilane (S-13), γ-methacryloxypropyltrimethoxysilane (S-14), γ-aminopropyltriethoxysilane (S-15), N-phenyl-γ-aminopropyltrimethoxysilane (S-16), N-phenyl-γ-aminopropyltrimethoxysilane (S-17), γ-mercaptopropyltrimethoxysilane (S-18), vinyltrichlorosilane (S-19), vinyltris(β-methoxyethoxysialne) (S-20), β-(3, 4-epoxycyclohexyl)ethyltrichlorosilane (S-21), methacrylate chromic chloride (S-22), 3-mercaptopropyltrimethoxysilane (S-23) and trifluoropropyltrichlorosilane (S-24).

For combinations of polymer materials and surface treating agents, eleven polymer materials and twenty three surface active agents are used to provide 11×24=264 combinations. Of these, eleven combinations of (P-01) and (S-01) to (S-11), seven combinations of (P-02) and (S-02), (S-03), (S-05) to (S-07), (S-10) and (S-11), four combinations of (P-03) and (S-01), (S-04), (S-08) and (S-09), eleven combinations of (P-04) and (S-01) to (S-11) and eleven combinations of (P-05) and (S-01) to (S-11) are preferred.

In the organic field effect transistors related to the first to fourth embodiments of the invention, the polymer material used can be one selected from the group consisting of eleven polymer materials of (P-01) to (P-11) indicated above and the surface treating agent can be one selected from the group consisting of twenty four surface agents of (S-01) to (S-23). More particularly, for the combinations of the polymer materials and the surface treating agents, there may be appropriately selected those combinations ensuring reaction between surface treating agents and polymer materials among combinations of the above-indicated eleven polymer materials and the twenty three surface treating agents, i.e. 11×24=264 combinations. Typical combinations include, for example, eleven combinations of (P-01) and (S-01) to (S-11) and seven combinations of (P-02) and (S-02), (S-03), (S-05) to (S-07), (S-10) and (S-11). It will be noted that for the combinations of polymer materials and surface treating agents capable of providing a gate insulating layer or an underlying layer wherein a surface treating agent is dispersed in a polymer material serving an insulating material, mention is made, for example, of four combinations of (P-03) and (S-01), (S-04), (S-08) and (S-09), eleven combinations of (P-04) and (S-01) to (S-11) and eleven combinations of (P-05) and (S-01) to (S-11).

As stated hereinabove, this application relates to a method for forming a stacked structure made of an insulating layer and an organic semiconductor layer, a method for making an organic field effect transistor according to the first or second embodiment of the invention, and also organic field effect transistors related to the first to fourth embodiments of the invention. In a preferred embodiment, mention is made of a joined structure or form between an organic semiconductor material constituting an organic semiconductor layer and a function group of a surface treating agent. In this case, the functional group of a surface treating agent is one selected from a methyl group, a phenyl group, a vinyl group, an epoxy group, a mercapto group, a glycidoxy group, a methacryl group, an amino group and a fluoro group. It should be noted that the functional group of the surface treating agents (S-01) to (S-11) to be bonded with an organic semiconductor material is a methyl group, the functional group of the surface treating agent (S-12) is a vinyl group, the functional group of the surface treating agent (S-13) is a glycidoxy group, the functional group of the surface treating agent (S-14) is a methacryl group, the functional group of the surface treating agent (S-15) is an amino group, the functional group of the surface treating agent (S-16) is a phenyl group, the functional group of the surface treating agent (S-17) is a phenyl group, the functional group of the surface treating agent (S-18) is a mercapto group, the functional group of the surface treating agent (S-19) is a vinyl group, the functional group of the surface treating agent (S-20) is a vinyl group, the functional group of the surface treating agent (S-21) is an epoxy group, the functional group of the surface treating agent (S-22) is a methacryl group, and the functional group of the surface treating agent (S-23) is a mercapto group.

In an embodiment, the insulating layer, gate insulating layer or underlying layer may further contain fine particles of an insulating material such as $SiO_x$, spin-on glass (SOG), silicon nitride ($SiN_y$), aluminium oxide ($Al_2O_3$), titanium oxide ($TiO_2$) and the like. Where the polymer material is reacted with a surface treating agent, a crosslinking agent capable of promoting the reaction may be contained.

Further, an insulating layer may be formed, for example, between an insulating layer and a support, between a support and a gate electrode or a gate insulating layer, or between an underlying layer and a support in the practice of the invention. The material for the insulating layer includes not only inorganic insulating materials for use, for example, as a metal oxide high dielectric, insulating material such as a $SiO_2$ material, SiN, $HfO_2$ or the like, but also such polymer materials serving as an insulating material indicated before, e.g. polymethyl methacrylate (PMMA), polyvinyl phenol (PVP), polyvinyl alcohol (PVA) and the like. These may be used singly or in combination, and the insulating layer may be so constituted as an underlying layer. Examples of the $SiO_2$ material include silicon dioxide ($SiO_2$), BPSG, PSG, BSG, AsSG, PbSG, silicon oxide nitride (SiON), SOG (spin-on glass), low dielectric $SiO_2$ material (e.g. a polyaryl ether, cycloperfluoro carbon polymer, benzocyclobutene, a cyclic fluorine resin, polytetrafluoroethylene, a fluorinated aryl ether, a fluorinated polyimide, amorphous carbon, organic SOG and the like). For the formation of an underlying layer, mention is made, for example, of physical vapor deposition methods (PVD method) such as, for example, a vacuum deposition method, a sputtering method and the like, various chemical vapor deposition methods (CVD method), and coating methods of liquid materials set out hereinbelow.

For the formation of an insulating layer, a gate insulating or an underlying layer, or for the coating of a solution of a mixture of a polymer material serving as an insulating material and a surface treating agent, onto a substrate, a support and a gate electrode, or a support, there may be used coating methods of liquid materials including: coating methods such as a spin coating method, an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, a calender coater method, a capillary coater method, a dipping method and the like; spraying methods; printing method such as a screen printing method or an ink jet printing method; methods using a dispenser; and casting methods.

Examples of an organic semiconductor material constituting an organic semiconductor layer include polythiophene, poly-3-hexylthiophene (P3HT) wherein a hexyl group is introduced into polythiophene, pentacene[2,3,6,7-dibenzoanthracene], polyanthracene, polypyrrole, polyaniline, polyacetylene polyphenylene, polyfuran, polyselenophene, polyisothianaphthene, polyphenylene sulfide, polyphenylene vinylene, polythienylene vinylene, polynaphthalene, polypyrene, polyazulene, phthalocyanine, merocyanine, polyethylenedioxythiophene, and poly(3,4-ethylendioxythiophene)/polystyrenesulfonic acid (PEDOT/PSS). For the formation of an organic semiconductor layer, mention is made, for example, of PVD methods such as a vacuum deposition method and a sputtering method, various CVD methods, a stamping method, a lift-off method, a shadow mask method, and such a method of coating a liquid material as mentioned above.

For a substrate used in the method for forming a stacked structure composed of an insulating layer and an organic semiconductor layer, mention is made, for example, of a support, or a support and a gate electrode formed thereon. Such a support as mentioned above, or a support used in the method for making an organic field effect transistor according to the first or second embodiment of the invention and also in the organic field effect transistors related to the first to fourth embodiments of the invention includes flexible plastic films, plastic sheets or plastic substrates made of organic polymers including, for example, polymethyl methacrylate (methyl polymethacrylate, PMMA), polyvinyl alcohol (PVA), polyvinyl phenol (PVP), polyether sulfone (PES), polyimides, polycarbonates, polyethylene terephthalate (PET), and polyethylene naphthalate. If a support constituted of such a flexible organic polymer as indicated above is used, the resulting organic field effect transistor can be appropriately assembled in or integrated with display devices or electronic devices having, for example, a curved profile. Alternatively, the support may include, for example, various types of glass substrates, various types of glass substrates formed with an insulating layer thereon, a quartz substrate, a quartz substrate formed with an insulating layer on the surface thereof, a silicon substrate formed with an insulating layer thereon, and a sapphire substrate. In some cases, conductive substrates (e.g. a metallic substrate and a substrate made of highly oriented graphite) may also be used as a support.

The materials for the gate electrode and source/drain electrodes used in the method according to the first or second embodiment of the invention and also in the organic field effect transistors according to the first to fourth embodiments of the invention include metals such as platinum (Pt), gold (Au), palladium (Pd), chromium (Cr), nickel (Ni), aluminium (Al), silver (Ag), tantalum (Ta), tungsten (W), copper (Cu), titanium (Ti), indium (In), tin (Sn), iron (Fe), zinc (Zn), magnesium (Mg) and the like, alloys containing these metals, conductive particles consisting of these metals, and conductive particles of the alloys of the type mentioned above. These electrodes may have a stacked structure of layers containing the metals indicated above, respectively. Moreover, for materials constituting the gate electrode and source/drain electrodes, mention may be made of organic materials such as poly(3,4-ethylenedioxythiophene)/polystyrenesulfonic acid (PEDOT/PSS) and polyaniline. For the formation of the gate electrode and the source/drain electrodes, any of methods including PVD methods such as a vacuum deposition method and a sputtering method, various CVD methods including a MOCVD method, a lift-off method, a shadow mask method, plating methods such as an electroplating method, an electroless plating method and a combination thereof, coating methods of liquid materials set out hereinbefore may be used although depending on the type of material used. As a matter of course, these methods may be used in combination with a patterning technique, if necessary.

For the material constituting a gate insulating film used in the method for making an organic field effect transistor according to the second embodiment or in the organic field effect transistors according to the third and fourth embodiments, mention is made not only of the afore-indicated inorganic insulating materials including, for example, $SiO_2$ materials, SiN and metal oxide high electric insulating materials, but also polymer materials serving as an insulating material as mentioned hereinbefore and including, for example, polymethyl methacrylate (PMMA), polyvinyl phenol (PVP), polyvinyl alcohol (PVA) and the like. These materials may be used in combination and the gate insulating film may be so constituted as such an underlying layer as set out before. For the formation of the gate insulating film, there may be used any of PVD methods such as a vacuum deposition method and a sputtering method, various CVD methods, and coating methods of liquid materials.

Where the organic field effect transistor of the invention is applied to and employed in display devices and various types of electronic devices, a monolithic integrated circuit wherein a number of organic field effect transistors are integrated may be fabricated. Alternatively, integrally formed organic field effect transistors may be broken into individual transistors to provide discrete parts. Still alternatively, an organic field effect transistor may be mounted on a support member and sealed with a resin.

In any of the method for forming a stacked structure composed of an insulating layer and an organic semiconductor layer, the method for making an organic field effect transistor according to the first embodiment of the invention, and the organic field effect transistors related to the first and second embodiments of the invention, an organic semiconductor layer is formed on an insulating layer obtained by use of a polymer material serving as an insulating material and a surface treating agent, so that since the surface treating agent exists in the surface of the insulating layer, the crystallinity of the organic semiconductor layer can be improved. In either of the method for making an organic field effect transistor according to the second embodiment or organic field effect transistors related to the third and fourth embodiments, the organic semiconductor layer is formed on an underlying layer obtained by use of a polymer material serving as an insulating material and a surface active agent. In this case, the crystallinity of the organic semiconductor is also improved due to the existence of the surface treating agent in the surface of the underlying layer. As a consequence, if a channel forming region is formed out of the organic semiconductor layer, it becomes possible to make an organic field effect transistor having high performance.

If it is attempted as in prior art to form an insulating layer or underlying layer only from an insulating polymer material, limitation is placed on the type of polymer to be used so as to permit OH groups to be uniformly exposed to the surface of the insulating layer or underlying layer, or limitation is placed on a forming process of the insulating layer or underlying layer. In this connection, however, according to am embodiment, the insulating layer, gate insulating layer or underlying layer is formed by use of an insulating polymer material and a surface treating agent, the surface of the insulating layer, gate insulating layer or underlying layer is under conditions where the OH groups of the surface treating agent are uniformly exposed to. Thus, the degree of freedom in selection of polymer material can be increased, with the attendant advantage over prior art in that an increased degree of freedom in selection of a forming process of the insulating layer, gate insulating layer or underlying layer is ensured.

Additional features and advantages are described herein, and will be apparent from, the following Detailed Description and the figures.

DETAILED DESCRIPTION

The application is more particularly described by way of examples with reference to the accompanying drawings.

EXAMPLE 1

Example 1 is direct to a method for forming a stacked structure including an insulating layer and an organic semiconductor layer, a method for making an organic field effect transistor according to a first embodiment, and an organic field effect transistor obtained by the method of the first embodiment. More specifically, this example relates to a bottom gate/bottom contact, organic filed effect transistor (hereinafter referred to simply as organic FET) and a method for making same.

Figure 1A:
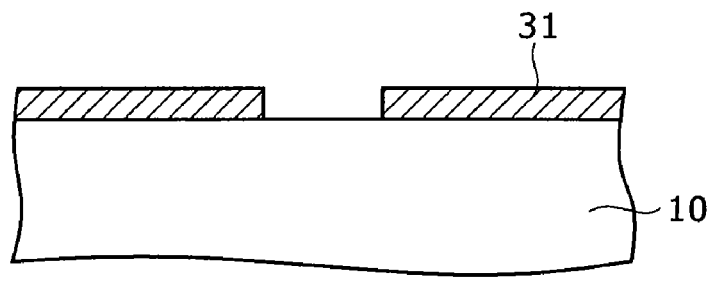
FIGS. 1A to 1D are, respectively, a schematic view, partially in section, of a support and a layer or layers formed thereon for illustrating the steps of a method for making an organic field effect transistor of Example 1.
Figure 1B:
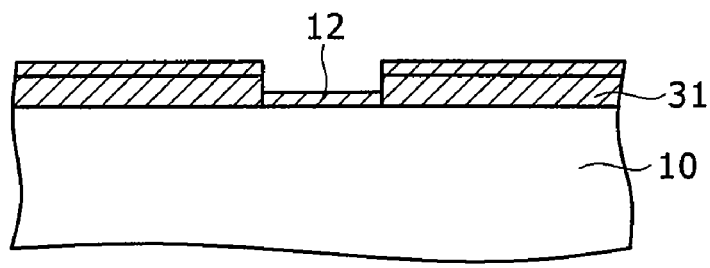
Figure 1C:
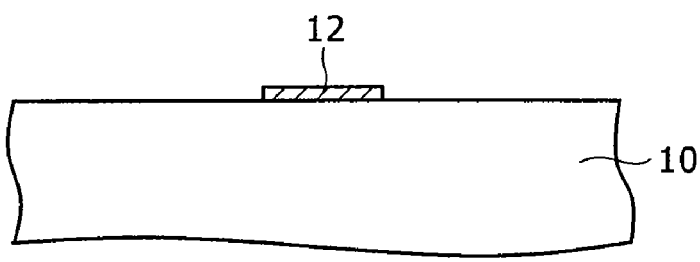
Figure 1D:
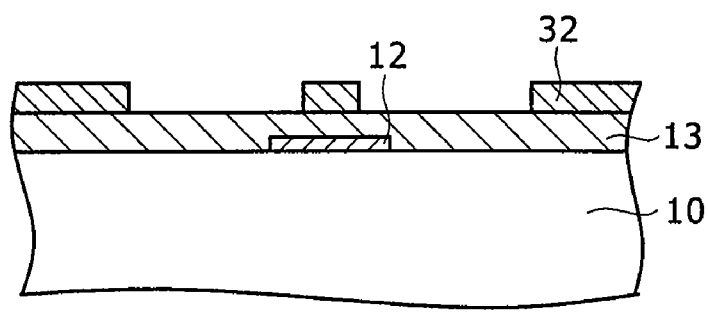
Figure 2A:
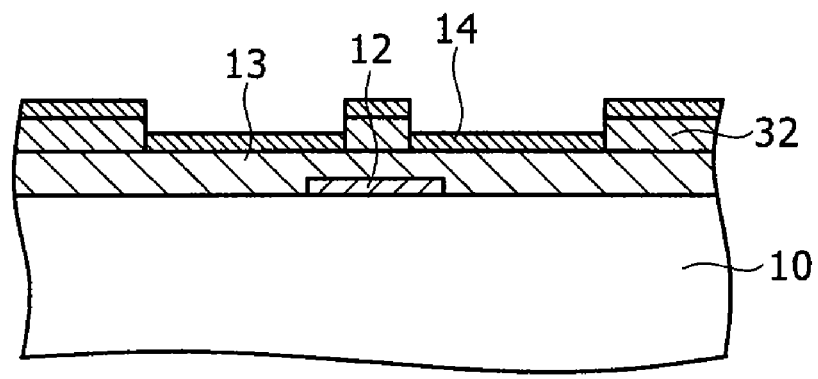
FIGS. 2A to 2C are, respectively, a schematic view, partially in section, of a support and a layer or layers formed thereon for illustrating the steps, subsequent to FIG. 1D, of a method for making an organic field effect transistor of Example 1.
Figure 2B:
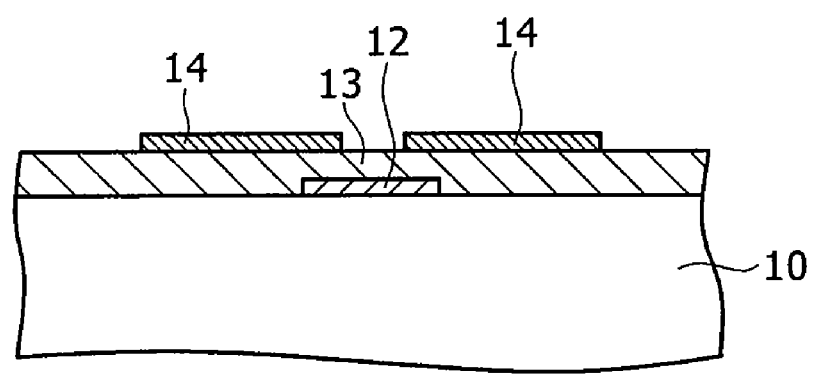
Figure 2C:
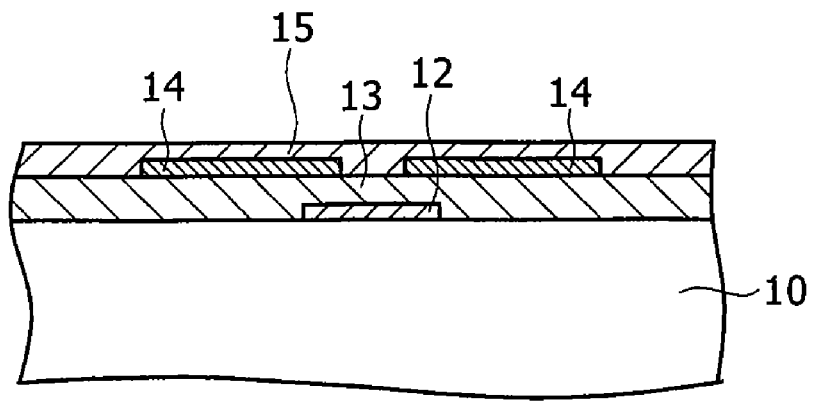
Figure 3A:
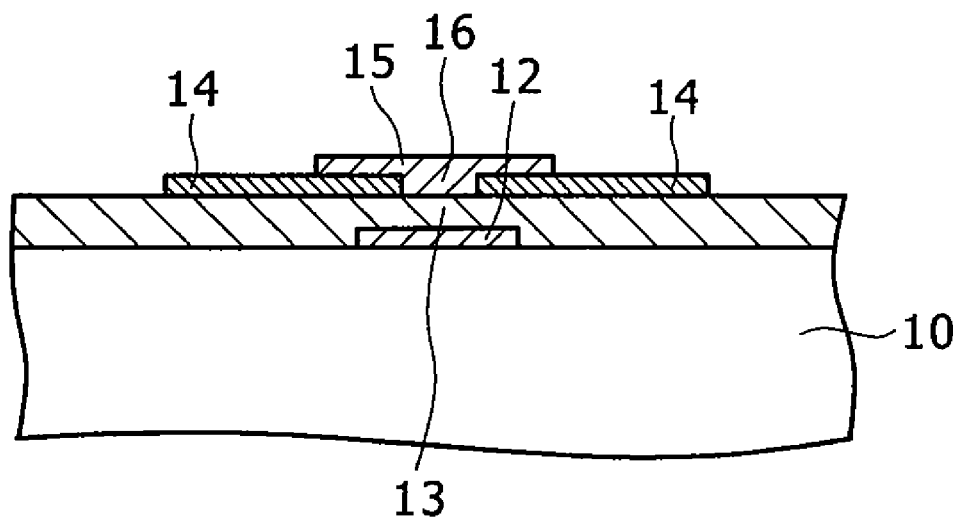
FIGS. 3A and 3B are, respectively, a schematic view, partially in section, of a support and a layer or layers formed thereon for illustrating the steps, subsequent to FIG. 2C, of a method for making an organic field effect transistor of Example 1.
Figure 3B:
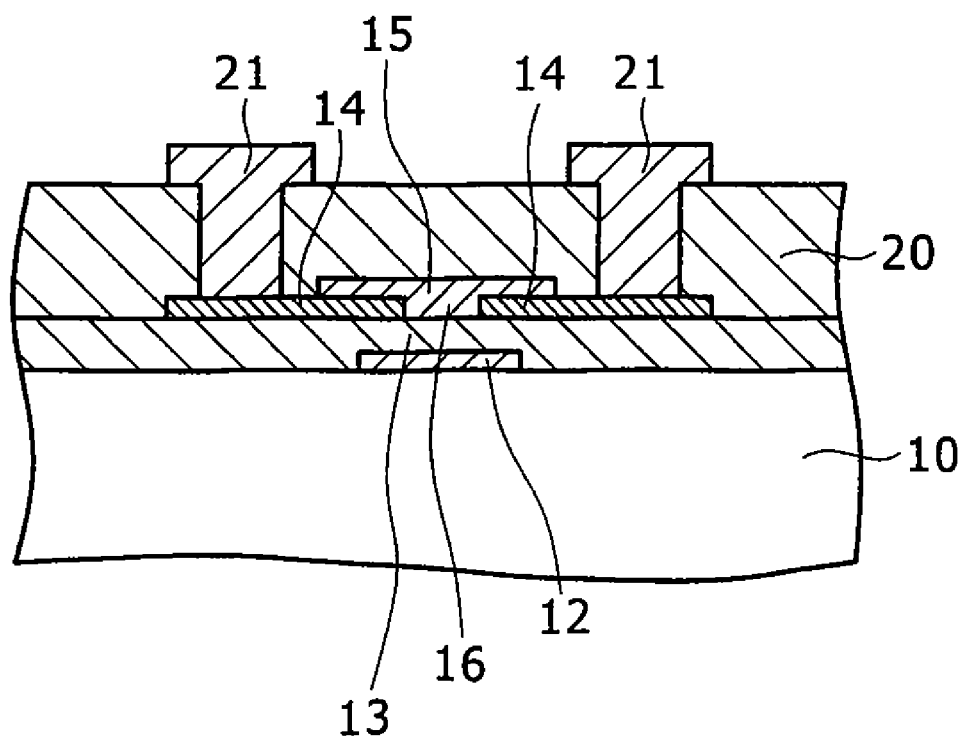

The bottom gate/bottom contact, organic FET of Example 1 shown in FIG. 3B that is a schematic view, partially in section, of the FET comprises;

(a) a gate electrode 12 formed on a support 10;

(b) a gate insulating layer 13 formed over the support 10 and the gate electrode 12;

(c) source/drain electrodes 14 formed on the gate insulating layer 13; and (d) a channel forming region 16 formed of an organic semiconductor layer 15 and formed on a portion of the gate insulating layer positioned between the source/drain electrode 14 and the source/drain electrode 14 in face-to-face relation with the gate electrode 12. The organic semiconductor layer 15 extends over the source/drain electrodes.

In Example 1 and Examples 2 to 5 described hereinafter, the insulating polymer material used is polyvinyl phenol (P-01),and the surface treating agent is octacdecyltrichlorosilane (S-01). The organic semiconductor material for the organic semiconductor layer and the functional group (i.e. a methyl group) of the surface treating agent are joined or bonded together. It will be noted that the combination of the polymer material and the surface treating agent may include, aside from the combination of (P-01) and (S-02), ten combinations of (P-01) and (S-02) to (S-11), seven combinations of (P-02) and (S-02), (S-03), (S-05) to (S-07), (S-10) and (S-11), four combinations of (P-03) and (S-01), (S-04), (S-08) and (S-09), eleven combinations of (P-04) and (S-01) to (S-11), and eleven combinations of (P-05) and (S-01) to (S-11). Further combinations may also be used.

With reference to FIGS. 1A to 1D, FIGS. 2A to 2C and FIGS. 3A and 3B that are, respectively, a schematic view, partially in section, of a support and a layer or layers formed thereon, a method for forming a stacked structure composed of an insulating layer and an organic semiconductor layer of Example 1 and a method for making an organic FET are illustrated.

Step 100

Initially, a gate electrode 12 is formed on a support 10. More particularly, a pattern for the formation of a gate electrode is formed on the support based on a resist layer 31 (see FIG. 1A). Next, a Ti layer serving as an adhesion layer and an Au layer serving as a gate electrode 12 are successively formed on the support 10 and the resist layer 31 by a vacuum deposition method (see FIG. 1B). In the figure, the adhesion layer is not shown. Upon the vacuum deposition, the support is mounted on a support holder (not shown) capable of controlling the temperature thereof, so that the rise of the support temperature can be suppressed during the course of the vacuum deposition. Thus, the film formation can be carried out while suppressing the deformation of the support 10 to a minimum. Thereafter, the resist layer 31 is removed by a lift-off method to obtain the gate electrode 12 made of an Au layer (see FIG. 1C).

Step 110

Next, a gate insulating layer 13 are formed over the support 10 and the gate electrode 12.

To this end, a solution of a mixture of an insulating polymer material and a surface treating agent is prepared. More particularly, octadecytrichlorosilane serving as a surface treating agent is added to a cyclopentanone solvent. Thereafter, polyvinyl phenol used as an insulating polymer material is further added to the resulting solution, followed by further addition of polymelanine-co-formaldehyde used as a crosslinking agent for facilitating crosslinking reaction. In this case, the mixing ratios are, for example, such that cyclopentanone: octadecyltrichlorosilane: polyvinyl phenol:polymelanine-co-formaldehyde=100 g:0.14 g:10 g:1.5 g. It will be noted that the ratio by weight between the polymer material and the surface treating agent should preferably be in the range of 100:0.5 to 100:5.

The solution is applied onto a substrate and dried to form an insulating layer on the substrate. That is, the solution is applied onto the support 10 and the gate electrode 12, followed by drying to form a gate insulating layer 13. More specifically, the solution is coated by a spin coating technique and dried in air at 130° C. for 20 min. This causes a crosslinking reaction to occur between the insulating polymer material and the surface treating agent, thereby permitting crosslinkage to occur therebetween.

Thereafter, source/drain electrodes 14 are formed on the gate insulating layer 13. More particularly, a pattern for forming source/drain electrodes is formed based on a resist layer 32 over an entire surface (see FIG. 1D). Next, a Ti layer serving as an adhesion layer and an Au layer serving as source/drain electrodes are successively formed over the gate insulating layer 13 and the resist layer 32 by a vacuum deposition method (see FIG. 2A). In the figure, the adhesion layer is not shown. In the course of the vacuum deposition, the support 10 is mounted onto a support holder (not shown) capable of controlling the temperature thereof, so that the rise of the support temperature can be suppressed during the course of the vacuum deposition. Thus, the film formation can be carried out while suppressing the deformation of the support 10 to a minimum. Thereafter, the resist layer 32 is removed by a lift-off method to obtain the source/drain electrodes 12 made of the Au layer (see FIG. 2B).

Step 130

Subsequently, an organic semiconductor layer is formed on the insulating layer. That is, an organic semiconductor layer 15 made of an organic semiconductor material and constituting a channel forming region 16 is formed on the gate insulating layer 13 (see FIG. 2C). More particularly, an organic semiconductor layer consisting of P3HT is formed over the source/drain electrodes 14 and the gate insulating layer 13 according to a spin coating method. Alternatively, an organic semiconductor layer 15 made of pentacene may be formed over the source/drain electrodes 14 and the gate insulating layer 13 according to a vacuum deposition method under conditions indicated in Table 2 below. Thereafter, the organic semiconductor layer is patterned, if necessary (see FIG. 3A).

TABLE 1

| Support temperature | 60° C. |
|---|---|
| Film-forming rate | 3 nm/minute |
| Pressure | $5 \times 10^{-4}$ Pa |

Step 140

Next, after formation of an insulating layer made of $SiO_2$ over a whole surface based on a known procedure, openings are formed at portions of the insulating layer 20 located above the gate electrode 12 and the source/drain electrodes 14, after which a wiring material layer is formed on the insulating layer 20 including the insides of the respective openings. The wiring material layer is patterned thereby forming a wiring (not shown) connected to the gate electrode 12 and wirings 21 connected to the source/drain electrodes 14 (see FIG. 3B). In this way, an organic FET of Example 1 is obtained.

An organic FET for evaluating a gate insulating layer was made. In this organic FET for evaluation (hereinafter referred to as organic FET of Example 1), a support used was a silicon semiconductor substrate doped with a highly concentrated p-type impurity. The silicon semiconductor substrate was formed thereon with a gate electrode 12 having a gate length of 5 μm, a gate insulating layer 13, source/drain electrodes 14, an organic semiconductor layer 15 and a channel-forming region 16. For comparison, an organic FET was experimentally made in the same manner as set out above except that a gate insulating layer was formed based on a solution wherein the surface treating agent (octadecyltrichlorosilane (S-01)) was removed from the composition used above. This FET was called organic FET of Comparative Example.

Figure 7:
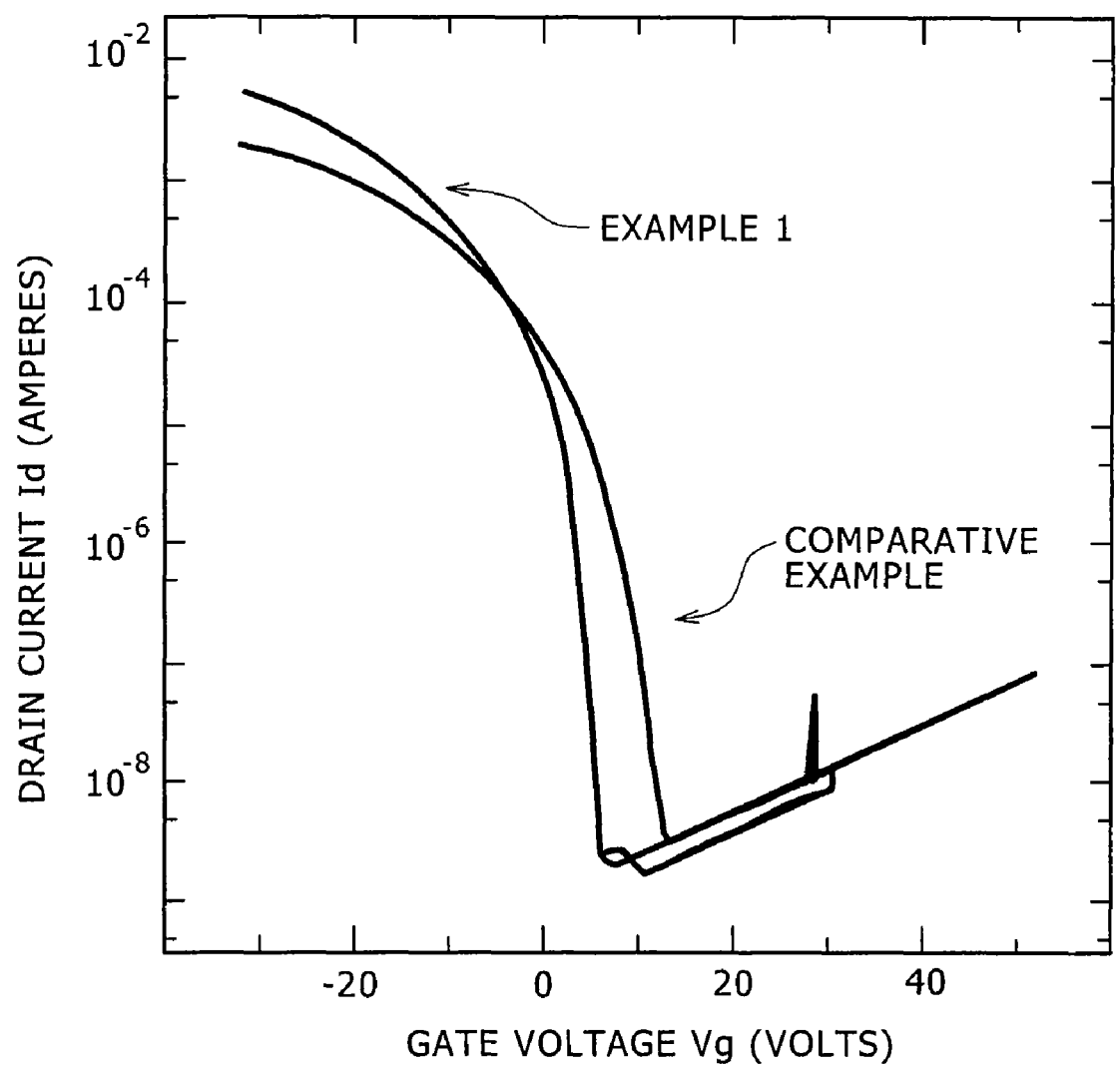
FIG. 7 is a graph showing the results of measurement of current $I_d$ passing between source and drain electrodes when a voltage $V_g$ applied to a gate electrode is changed under such conditions that a voltage of 30 volts is applied between the source and drain electrodes for the organic field effect transistor of Example 1 and an organic field effect transistor of Comparative Example.

The results of measurement of a contact angle (θ) of the gate insulating layers of the organic FET's of Example 1 and Comparative Example are shown in Table 2 below. In accordance with the same procedure as in [Step 110], the solution was applied by a spin coating method and dried in air for 20 min, and a temperature at which crosslinking reaction was caused to occur was measured and determined as an optimum drying temperature. The results are also shown in Table 2. Moreover, the results of measurement of current $I_d$ passing between the source/drain electrodes when a voltage $V_g$ was changed under conditions that −30 volts were applied between the source/drain electrodes are shown in FIG. 7. In addition, the results of measurement of mobility indicated in terms of sub-threshold swing value (referred to simply as STS for convenience's sake) are also shown in Table 2.

TABLE 2

|  | Example 1 | Comparative Example |
|---|---|---|
| Contact angle (θ) (°) | 80 | 60 |
| Optimum drying temperature (° C.) | 130 | 180 |
| Mobility (cm$^2$ · V$^{-1}$ · second$^{-1}$) | 0.12 | 0.038 |
| STS value (V · degree$^{-1}$) | 0.96 | 1.57 |

From FIG. 7 and Table 2, it will be seen that the organic FET of Example 1 is superior to the organic FET of Comparative Example with respect to the FET characteristics including the V-$I_d$ characteristic, mobility and STS value, with the optimum drying temperature being lower.

EXAMPLE 2

Example 2 is a variation of Example 1. In Example 1, the gate insulating layer 13 (or insulating layer) was formed directly over the support 10 and the gate electrode 12. In Example 2, an insulating film was formed between the support 10 and the gate electrode 12 and the gate insulating layer (or between the insulating layer and the substrate). It will be noted that in Example 2, the gate insulating layer 13 (or insulating layer) could be formed in a thickness smaller than the gate insulating layer (or insulating layer) of Example 1. Where an insulating material layer having a two-layer structure of an insulating layer and the gate insulating layer 13 (or insulating layer) is considered, a degree of freedom in selection of a type of material and a degree of freedom of thickness design for optimizing characteristic properties such as a withstand voltage in the insulating material layer can be improved.

In order to form the insulating film, a solution having a viscosity lower than in Example 1 is prepared in Example 2. More particularly, octadecyltrichlorosilane serving as a surface treating agent is added to a cyclopentanone solvent. Next, polyvinyl phenol serving as an insulating polymer material is further added to the resulting solution, followed by further addition of polymelanine-co-formaldehyde used as a crosslinking agent for promoting crosslinking reaction. In this case, the mixing ratios are, for example, such that cyclopentanone:octadecyltrichlorosilane:polyvinyl phenol:polymelanine-co-formaldehyde=10 g:4 mg:2 g:0.3 g.

In Example 2, a similar procedure as in [Step 100 of Example 1 was repeated, after which an insulating film made, for example, of SiO$_2$ was formed on the support 10 (or a substrate) including the gate electrode 12 by a sputtering method. Next, such a solution as indicated above was applied onto the insulating film in the same manner as in [Step 110] of Example 1 and dried to form the gate insulating layer 13 (or insulating layer) over the gate electrode 12 and support 10 (or substrate).

Thereafter, the steps of [Step 120] to [Step 140] of Example 1 were repeated to obtain an organic FET of Example 2.

EXAMPLE 3

Example 3 relates to a method for forming a stacked structure made of a insulating layer and an organic semiconductor layer according to the invention, an organic FET according to the second embodiment, and a method for making an organic FET according to the first embodiment of the invention and more particularly, to a bottom gate/top contact, organic FET and a method for making same.

Figure 4A:
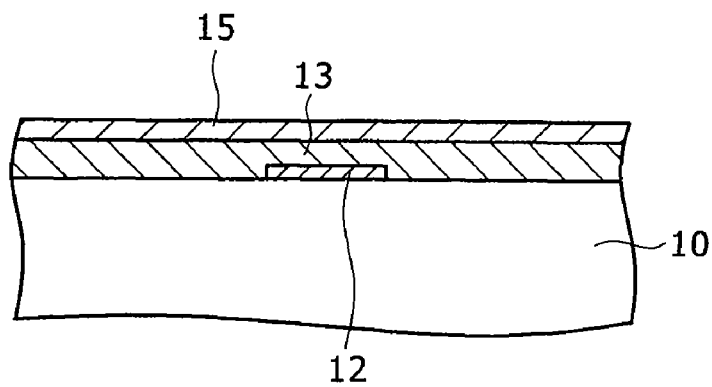
FIGS. 4A to 4C are, respectively, a schematic view, partially in section, of a support and a layer or layers formed thereon for illustrating the steps of a method for making an organic field effect transistor of Example 3.
Figure 4B:
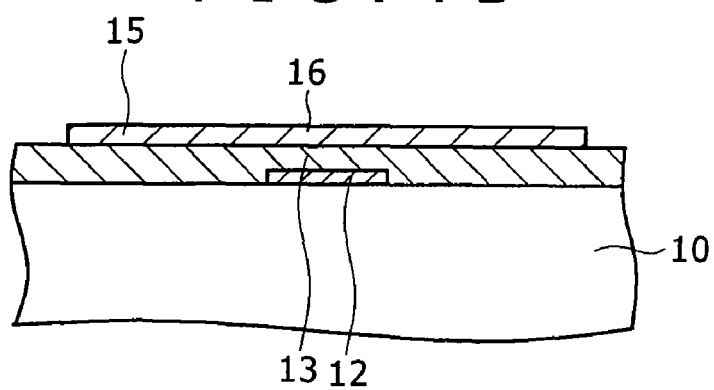
Figure 4C:
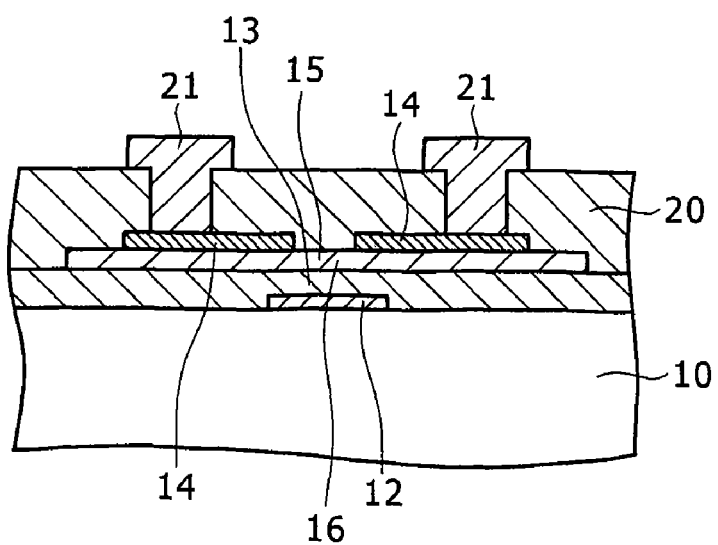

The bottom gate/top contact, organic FET of Example 3 of the type shown in FIG. 4C that is a schematic, partially sectional view comprises:

(a) a gate electrode 12 formed on a support 10;

(b) a gate insulating layer 13 formed over the support 10 and the gate electrode 12; and (c) a channel forming region 16 constituted of an organic semiconductor layer 15 and formed over the gate insulating layer 13 in face-to-face relation with the gate electrode 12; and (d) source/drain electrodes 14 formed on the organic semiconductor layer 15 so as to sandwich the channel forming region 16 therebetween. The gate insulating layer 13 is formed by reaction between a surface treating agent and an insulating polymer material.

The organic FET of Example 3 has the same arrangement as the organic FET of Example 1 except that this FET is reversed to the organic FET of Example 1 with respect to the state of vertical position of the source-drain electrodes 14 and the organic semiconductor layer 15. Hence, the details of the organic FET of Example 3 are not described herein.

With reference to FIGS. 4A to 4C that are, respectively, a schematic view, partially in section, of a support and the like, a method for forming a stacked structure made of an insulating layer and an organic semiconductor layer of Examples 3 and a method for making an organic DET are illustrated.

Step 300

First, a gate electrode 12 is provided on a support 10 in an manner similar to [Step 100] of Example 1.

Step 310

Next, a solution is applied onto substrate in a manner similar to [Step 110] of Example 1 and dried to form an insulating layer on the substrate. That is, a solution is applied onto a support 10 and a gate insulating electrode 12 and dried to form a gate insulating layer 13.

Step 320

Thereafter, an organic semiconductor layer is formed on the insulating layer in a manner similar to [Step 130] of Example 1. More specifically, an organic semiconductor layer 15 consisting of an organic semiconductor material and forming a channel forming region 16 is formed on the gate insulating layer(see FIGS. 4A and 4B).

Step 330

Subsequently, source/drain electrodes 14 made of an Au layer are formed on the organic semiconductor layer 15. More particularly, a Ti layer serving as an adhesion layer and Au layer serving as source/drain electrodes are successively formed on the organic semiconductor layer 15 by a vacuum deposition technique in such a state that part of the organic semiconductor layer 15 and the gate insulating layer 13 are covered with a hard mask. In the figures, the adhesion layer is not shown. In this way, the source/drain electrodes 14 made of the Au layer can be formed without resorting to a photolithographic process.

Step 340

Next, an insulating layer made of $SiO_2$ is formed over the entire surface according to a known procedure in a manner similar to [Step 140] of Example 1, after which openings are formed at portions of the insulating layer 20 above the gate electrode 12 and the source/drain electrodes 14. A wiring material layer is formed on the insulating layer 20 including the inside of these openings. The wiring material layer is patterned to form a wiring (not shown) connected to the gate electrode 12 and wirings 21 connected to the source/drain electrodes 14 (see FIG. 4C). In this manner, an organic FET of Example 3 can be obtained.

It will be noted that the step of Example 2 may be applied to [Step 310] of Example 3.

EXAMPLE 4

Example 4 id directed to a method for forming a stacked structure mad of an insulating layer and organic semiconductor layer according to the invention, an organic field effect transistor according to the third embodiment of the invention and a method for making an organic field effect transistor according to the second embodiment of the invention, more particularly, to a method for making a top gate/bottom contact, organic FET.

Figure 5A:
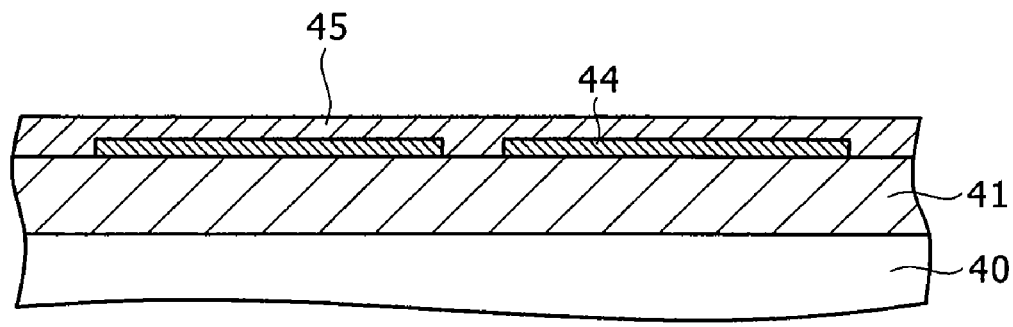
FIGS. 5A to 5C are, respectively, a schematic view, partially in section, of a support and a layer or layers formed thereon for illustrating the steps of a method for making an organic field effect transistor of Example 4.
Figure 5B:
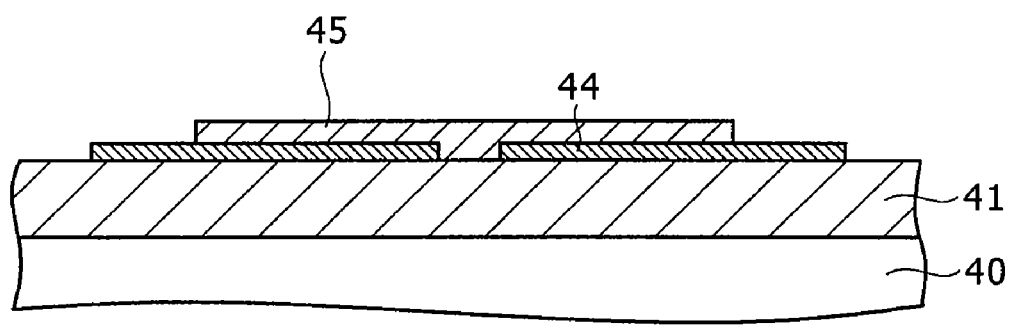
Figure 5C:
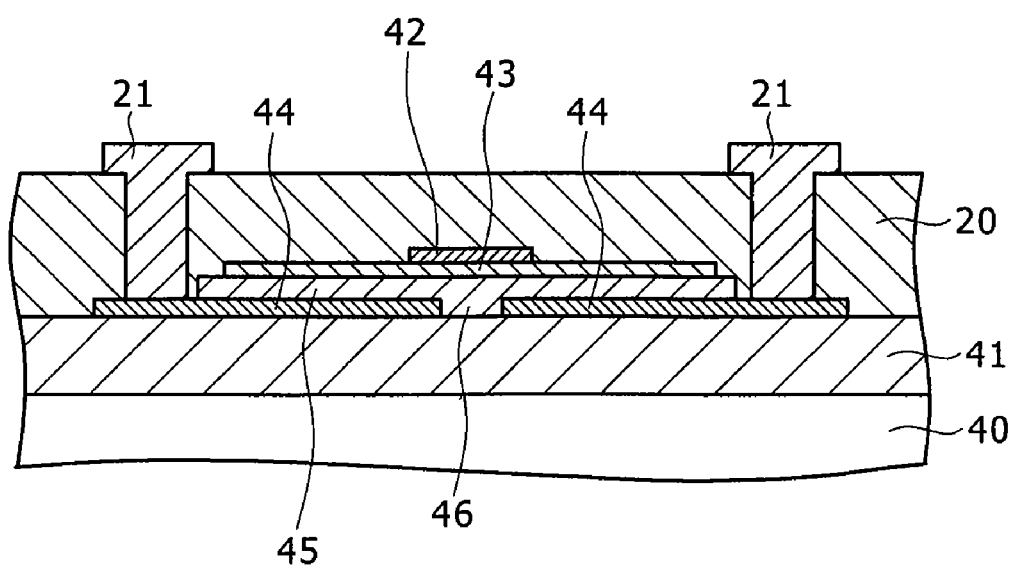

The organic FET of the top gate/bottom contact type of Example 4 shown in FIG. 5C that is a schematic view, partially in section comprises:

(a) an underlying layer 41 formed on a support 40;

(b) source/drain electrodes 44 formed on the underlying layer 41;

(c) a channel forming region 46 constituted of an organic semiconductor layer 45 and formed on a portion of the underlying layer 41 position between the source/drain electrodes 44 and the source/drain electrodes 44;

(d) a gate insulating film 43 formed on the organic semiconductor layer 45; and (e) a gate electrode 42 formed on the gate insulating film in face-to face relation with the channel forming region 46. The underlying layer 41 is formed by reaction between a surface treating agent and an insulating polymer material.

In Example 4 or Example 5 described hereinafter, the materials used for the support 40, gate electrode 42 and source/drain electrodes 44, and organic semiconductor layer 45 are same as those used in Example 1. Further, polymer materials as a insulating materials used for the underlying layer 41 are same as those used in Example 1. The gate insulating film 43 was formed of $SiO_2$.

With reference to FIGS. 5A to 5C that are, respectively, a schematic view, partially in section, of a support and the like, a method for forming a stacked structure made of an insulating layer and an organic semiconductor layer of Examples 4 and a method for making an organic FET are illustrated.

Step 400

Initially, a solution is applied onto a substrate in the same manner as in [Step 110] of Example 1 to form an insulating layer on a substrate. Alternatively, a solution of a mixture of an insulating polymer material and a surface treating agent is applied onto a support 40 and dried to form an underlying layer 41.

Step 410

Next, in the same manner as in [Step 120] of Example 1, source/drain electrodes 44 are formed on the underlying layer 41.

Step 420

Next, an organic semiconductor layer is formed on the insulating layer. Alternatively, an organic semiconductor layer 45 made of an organic semiconductor material and constituting a channel forming region 46 is formed on the underlying layer 41. More particularly, in the same manner as in [Step 130] of Example 1, the organic semiconductor layer 45 is formed on the underlying layer 41 and source/drain electrodes 44 (see FIGS. 5A and 5B). Still more particularly, the organic semiconductor layer 45 made of P3HT is formed on the underlying layer 41 and source/drain electrodes 44 according to a spin coating method. Alternatively, an organic semiconductor layer 45 made of pentacene may be formed on the underlying layer 41 and source/drain electrodes 44 according to a vacuum deposition method as exemplified in Table 1.

Step 430

Thereafter, an insulating film 43 made of $SiO_2$ is formed on the organic semiconductor layer 45, (particularly over the entire surface), for example, by a sputtering method.

Step 440

Subsequently, an adhesion layer made of a Ti layer and a gate electrode 42 made of an Au layer are, respectively, formed on the gate insulating film 43 in the same manner as in [Step 100] of Example 1. In the figure, the adhesion layer is not shown. Alternatively, a Ti layer used as an adhesion layer and an Au layer serving as a gate electrode may be successively formed on the gate insulating film 43 by a vacuum deposition method in such a state that part of the gate insulating film 43 is covered with hard mask. In this way, the gate electrode 42 can be formed without resorting to a photolithographic process.

Step 450

Next, an insulating layer 20 made of $SiO_2$ is formed on the entire surface by a known procedure in the same manner as in [Step 140] of Example 1, after which openings are formed at portions of the insulating layer 20 located above the gate electrode 42 and source/drain electrodes 44. A wiring material layer is formed over the insulating layer 20 including the inside of the openings, followed by patterning of the wiring material layer to form a wiring (not shown) connected to the gate electrode 42 and wirings 21 connected to the source/drain electrodes 44 (see FIG. 5C). In this manner, an organic FET of Example 4 can be obtained.

It will be noted that the step of Example 2 may be applied to [Step 400] of Example 4.

EXAMPLE 5

Example 5 is directed to a method for forming a stacked structure made of an insulating layer and an organic semiconductor layer according to the invention, an organic FET according to the fourth embodiment of the invention and a method for making a organic FET according to the second embodiment of the invention, and more particularly, to a top gate/top contact, organic FET and a method for making same.

Figure 6A:
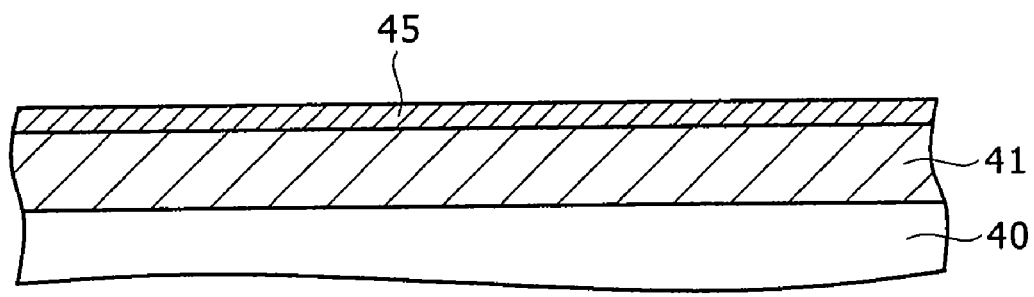
FIGS. 6A to 6C are, respectively, a schematic view, partially in section, of a support and a layer or layers formed thereon for illustrating the steps of a method for making an organic field effect transistor of Example 5.
Figure 6B:
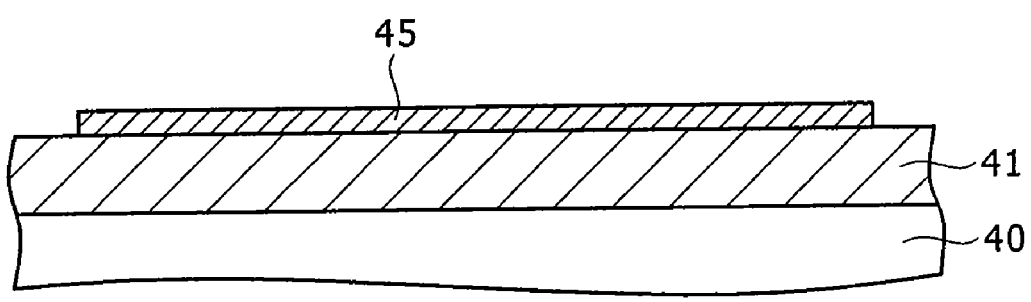
Figure 6C:
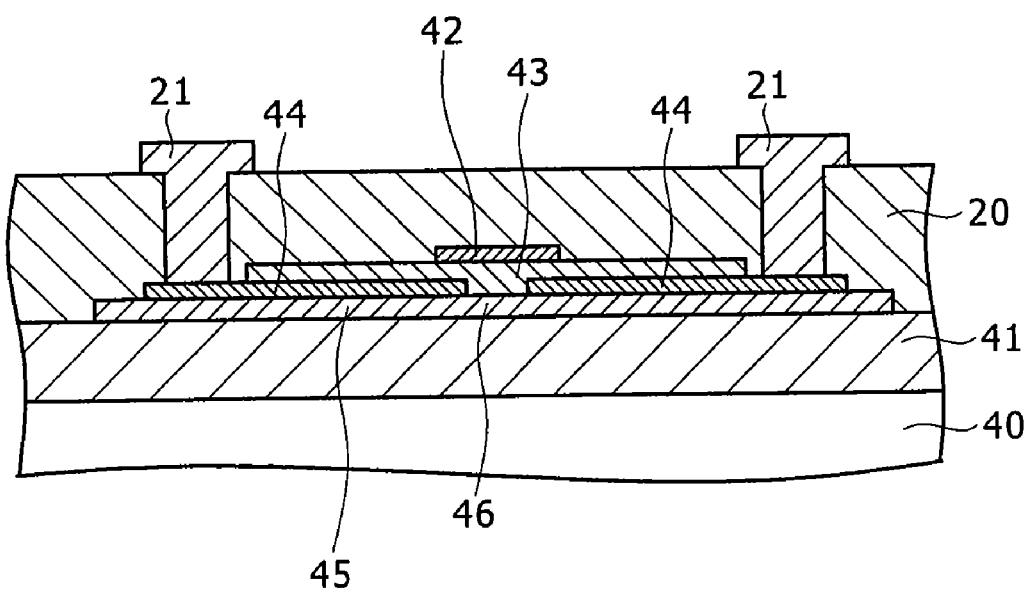

The top gate/top contact, organic FET of Example 5 shown in FIG. 6C that is a schematic view, partially in section comprises:

(a) an underlying layer 41 formed on a support 40;

(b) a channel forming region 46 constituted of an organic semiconductor layer 45 and formed on the underlying layer 41;

(c) source/drain electrodes 44 formed on the organic semiconductor layer 45 so as to sandwich the channel forming region 46 therebetween;

(d) a gate insulating file 43 formed over the channel forming region 46 and the source/drain electrodes 44; and (e) a gate electrode 42 formed on the gate insulating film 43 in face-to-face relation with the channel forming region 46.

The underlying layer is formed by reaction between a surface treating agent and an insulating polymer material.

The organic FET of Example 5 has the same arrangement as the organic FET of Example 4 except that the vertical arrangement of the source/drain electrodes 44 and the organic semiconductor layer 45 are reversed to that of organic FET of Example 4. Accordingly, the detailed description of the organic FET of Example 5 is omitted.

With reference to FIGS. 6A to 6C that are, respectively, a schematic, partially sectional view, a method for forming a stacked structure made of an insulating layer and organic semiconductor layer and a method for making an organic FET according to Example 5 are illustrated.

Step 500

Initially, a solution is applied onto a substrate and dried to form an insulating layer on the substrate in the same manner as in [Step 110] of Example 1. Alternatively, a solution of a mixture of an insulating polymer material and a surface treating agent is applied onto a support 40 and dried to form an underlying layer 41.

Step 510

Next, an organic semiconductor layer 45 made of an organic semiconductor material and constituting a channel forming region 46 is formed on the underlying layer in the same manner as in [Step 130] of Example (see FIGS. 6A and 6B). More particularly, an organic semiconductor layer 45 made of P3HT is formed on the underlying layer 41 and the source/drain electrodes 44 according to a spin coating method. Alternatively, an organic semiconductor layer 45 formed of pentacene is formed on the underlying layer 41 according to a vacuum deposition method exemplified in Table 1.

Step 520

Thereafter, source/drain electrodes 44 are formed on the underlying layer 41 in the same manner as in [Step 120] of Example 1.

Step 530

A gate insulating film 43 made of $SiO_2$ is subsequently formed on the entire surface, for example, by a sputtering method.

Step 540

Subsequently, an adhesion layer made of a Ti layer and a gate electrode 42 made of an Au layer are, respectively, formed on the gate insulating film 43 in the same manner as in [Step 100] of Example 1. In the figure, the adhesion layer is not shown. Alternatively, a Ti layer used as an adhesion layer and an Au layer serving as a gate electrode may be successively formed on the gate insulating film 43 by a vacuum deposition method in such a state that part of the gate insulating film 43 is covered with hard mask. In this way, the gate electrode 42 can be formed without resorting to a photolithographic process.

Step 550

Next, an insulating layer 20 made of $SiO_2$ is formed on the entire surface by a known procedure in the same manner as in [Step 140] of Example 1, after which openings are formed at portions of the insulating layer 20 located above the gate electrode 42 and source/drain electrodes 44. A wiring material layer is formed over the insulating layer 20 including the inside of the openings, followed by patterning of the wiring material layer to form a wiring (not shown) connected to the gate electrode 42 and wirings 21 connected to the source/drain electrodes 44 (see FIG. 6C). In this manner, an organic FET of Example 5 can be obtained.

It will be noted that the step of Example 2 may be applied to [Step 500] of Example 5.

Although embodiments have been illustrated above, the invention should not be construed as limiting thereto. The structures of the organic FET's and manufacturing conditions are merely exemplified and may be appropriately varied. It will be noted that where the organic FET of the invention is applied to or used in diverse electronic devices such as display devices, a monolithic integrated circuit wherein a number of organic FET's are integrated in a substrate may be provided, or organic FET's may be cut off from one another to individually provide discrete FET's.

In the examples, the insulating layer, gate layer or underlying layer has been formed by a spin coating method. Instead, a solution containing an insulating polymer material may be applied onto a substrate, or on a support and a gate electrode, or on a support in a container filled with a vapor of a surface treating agent, and dried to form an insulating layer on the substrate or to form a gate insulating layer on the support and gate electrode, or to form an underlying layer on a support. More particularly, the solution containing an insulating polymer material (e.g. polyvinyl phenol) is spin coated under conditions where a processing chamber of a spin coater is in an atmosphere of a vapor of a surface treating agent (e.g. octadecyltrichlorosilane). Alternatively, an insulating layer made of an insulating polymer material (e.g. polyparaxyene) and a surface treating agent, a gate insulating layer and an underlying layer may be formed on a substrate or a support and a gate electrode, or on a support. In this case, a gas containing a surface treating agent may be used as a carrier gas.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for making an organic field effect transistor comprising:
    (a) forming a gate electrode on a support and subsequently forming a gate insulating layer on said support and said gate electrode; and
    (b) forming, on said gate insulating film, source/drain electrodes and an organic semiconductor layer made of an organic semiconductor material and constituting a channel forming region, wherein
    said gate insulating layer is formed by applying a liquid-liquid solution of a mixture of a polymer material serving as an insulating material and a surface treating agent onto said support and said gate electrode and drying said solution.

2. The method as set forth in claim 1, wherein
    said polymer material is a member selected from the group consisting of:
    polyvinyl phenol, polyvinyl alcohol, polymethyl methacrylate, polyparaxylene, polyhydroxymethylstyrene, polyvinyl acetate, polystyrene, polyvinyl styrene, polypropylene, polycarbonate and polyvinylidene fluoride; and
    said surface treating agent is a member selected from the group consisting of octadecytrichlorosilane, octadecyltrimethoxysilane, octadecyltriethoxysilane, octyltrichlorosilane, octyltrimethoxysilane, octyltriethoxysilane, hexamethyldisilazane, methylvinyltrichlorosilane, octadecyldimethylchlorosilane, dimethyldimethoxysilane, methyltrimethoxysilane, vinyltriethoxysilane, γ-glycidoxypropyltrimethoxysilane, γ-methacryloxypropyltrimethoxysilane, γ-aminopropyltriethoxysilane, N-phenyl-γ-aminopropyltrimethoxysilane, N-phenyl-γ-aminopropyltrimethoxysilane, γ-mercaptopropyltrimethoxysilane, vinyltrichlorosilane, vinyltris(β-methoxyethoxysilane), β-(3,4-epoxycyclohexyl)ethyltrichlorosilane, methacrylate chromic chloride, 3-mercaptopropyltrimethoxysilane and trifluoropropyltrichlorosilane.

3. The method as set forth in claim 1, wherein an organic semiconductor material constituting said organic semiconductor layer and a functional group of said surface treating agent are joined together.

4. The method as set forth in claim 3, wherein said functional group of said surface treating agent is one selected from the group consisting of:
    a methyl group, a phenyl group, a vinyl group, an epoxy group, a mercapto group, a glycidoxy group, a methacryl group, an amino group and fluoro group.

5. A method for making an organic field effect transistor comprising:
    (a) forming an underlying layer on a support;
    (b) forming, on said underlying layer, source/drain electrodes and an organic semiconductor layer made of an organic semiconductor material and constituting a channel forming region; and
    (c) forming a gate electrode at least on said organic semiconductor layer through a gate insulating layer, wherein
    said underlying layer is formed by applying a liquid-liquid solution of a mixture of a polymer material serving as an insulating material and a surface treating agent onto said support, and drying said solution.

6. The method as set forth in claim 5, wherein
    said polymer material is a member selected from the group consisting of:
    polyvinyl phenol, polyvinyl alcohol, polymethyl methacrylate, polyparaxylene, polyhydroxymethylstyrene, polyvinyl acetate, polystyrene, polyvinyl styrene, polypropylene, polycarbonate and polyvinylidene fluoride; and
    said surface treating agent is a member selected from the group consisting of, octadecytrichlorosilane, octadecyltrimethoxysilane, octadecyltriethoxysilane, octyltrichlorosilane, octyltrimethoxysilane, octyltriethoxysilane, hexamethyldisilazane, methylvinyltrichlorosilane, octadecyldimethylchlorosilane, dimethyldimethoxysilane, methyltrimethoxysilane, vinyltriethoxysilane, γ-glycidoxypropyltrimethoxysilane, γ-methacryloxypropyltrimethoxysilane, γ-aminopropyltriethoxysilane, N-phenyl-γ-aminopropyltrimethoxysilane, N-phenyl-γ-aminopropyltrimethoxysilane, γ-mercaptopropyltrimethoxysilane, vinyltrichlorosilane, vinyltris(β-methoxyethoxysilane), β-(3,4-epoxycyclohexyl)ethyltrichlorosilane, methacrylate chromic chloride, 3-mercaptopropyltrimethoxysilane and trifluoropropyltrichlorosilane.

7. The method as set forth in claim 5, wherein an organic semiconductor material constituting said organic semiconductor layer and a functional group of said surface treating agent are joined together.

8. The method as set forth in claim 7, wherein said functional group of said surface treating agent is one selected from the group consisting of:
    a methyl group, a phenyl group, a vinyl group, an epoxy group, a mercapto group, a glycidoxy group, a methacryl group, an amino group and fluoro group.

9. The method as set forth in claim 1, wherein
    said polymer material is a member selected from the group consisting of:
    polyvinyl alcohol, polyparaxylene, polyhydroxymethylstyrene, polyvinyl acetate, polystyrene, polyvinyl styrene, polypropylene, polycarbonate and polyvinylidene fluoride; and
    said surface treating agent is a member selected from the group consisting of octadecytrichlorosilane, octadecyltrimethoxysilane, octadecyltriethoxysilane, octyltrichlorosilane, octyltriethoxysilane, hexamethyldisilazane, methylvinyltrichlorosilane, octadecyldimethylchlorosilane, dimethyldimethoxysilane, methyltrimethoxysilane, vinyltriethoxysilane, γ-glycidoxypropyltrimethoxysilane, γ-methacryloxypropyltrimethoxysilane, γ-aminopropyltriethoxysilane, N-phenyl-γ-aminopropyltrimethoxysilane, N-phenyl-γ-aminopropyltrimethoxysilane, γ-mercaptopropyltrimethoxysilane, vinyltrichlorosilane, vinyltris(β-methoxyethoxysilane), β-(3,4-epoxycyclohexyl)ethyltrichlorosilane, methacrylate chromic chloride, 3-mercaptopropyltrimethoxysilane and trifluoropropyltrichlorosilane.

10. The method as set forth in claim 5, wherein
    said polymer material is a member selected from the group consisting of:
    polyvinyl phenol, polyvinyl alcohol, polyparaxylene, polyhydroxymethylstyrene, polyvinyl acetate, polystyrene, polyvinyl styrene, polypropylene, polycarbonate and polyvinylidene fluoride; and said surface treating agent is a member selected from the group consisting of octadecytrichlorosilane, octadecyltrimethoxysilane, octadecyltriethoxysilane, octyltrichlorosilane, octyltriethoxysilane, hexamethyldisilazane, methylvinyltrichlorosilane, octadecyldimethylchlorosilane, dimethyldimethoxysilane, methyltrimethoxysilane, vinyltriethoxysilane, γ-glycidoxypropyltrimethoxysilane, γ-methacryloxypropyltrimethoxysilane, γ-aminopropyltriethoxysilane, N-phenyl-γ-aminopropyltrimethoxysilane, N-phenyl-γ-aminopropyltrimethoxysilane, γ-mercaptopropyltrimethoxysilane, vinyltrichlorosilane, vinyltris(β-methoxyethoxysilane), β-(3,4-epoxycyclohexyl)ethyltrichlorosilane, methacrylate chromic chloride, 3-mercaptopropyltrimethoxysilane and trifluoropropyltrichlorosilane.

\* \* \* \* \*